(12) United States Patent
Anthony et al.

(10) Patent No.: US 6,690,029 B1
(45) Date of Patent: Feb. 10, 2004

(54) SUBSTITUTED PENTACENES AND ELECTRONIC DEVICES MADE WITH SUBSTITUTED PENTACENES

(75) Inventors: John E. Anthony, Lexington, KY (US); David L. Eaton, Lexington, KY (US); Sean Parkin, Lexington, KY (US)

(73) Assignee: University of Kentucky Research Foundation, Lexington, KY (US)

( * ) Notice: Subject to any disclaimer, the term of this patent is extended or adjusted under 35 U.S.C. 154(b) by 0 days.

(21) Appl. No.: 10/143,405

(22) Filed: May 10, 2002

Related U.S. Application Data

(60) Provisional application No. 60/314,968, filed on Aug. 24, 2001.

(51) Int. Cl.[7] ............................................. H01L 51/00
(52) U.S. Cl. ........................................ 257/40; 257/289
(58) Field of Search .................. 257/40, 289, E51.049; 252/700, 62.39, 301.16, 301.35; 438/99

(56) References Cited

U.S. PATENT DOCUMENTS

| | | | |
|---|---|---|---|
| 3,557,233 A | 1/1971 | Zweig et al. | |
| 3,729,426 A | 4/1973 | Zweig et al. | |
| 3,970,660 A | 7/1976 | Bollyky | |
| 6,344,284 B1 | 2/2002 | Chou | |
| 6,361,885 B1 | 3/2002 | Chou | |

OTHER PUBLICATIONS

Miller, Glen P., et al., π–Stacking Interactions in cis–Bis-fullerene[60] Adducts of 6,13–Disubstituted Pentacenes, Organic Letters 2000, pp. 3983–3986, vol. 2, No. 25.

Vaslin, Sophie; Richard, Joel; Teychenne, Dominique; Ricchiero, Frederick; Lerner, Dan. Fluorescent Latexes Containing at Least Two Fluorochromes For Use as Markers, Especially In Biology. Fr. Demande (1995).

Rauhut, M.M., et al., Infrared Liquid–Phase Chemiluminescence from Reactions of Bis (2,4,6–trichlorophenyl) Oxalate, Hydrogen Peroxide, and Infrared Fluorescent Compounds, J. Org. Chem., vol. 40, No. 3, 1975.

Maulding, D.R., et al., Electronic Absorption and Fluorescence of Phenylethynyl–Substituted Acenes. J. Org. Chem. vol. 54, No. 6, Jun. 1969.

*Primary Examiner*—Sara Crane
(74) *Attorney, Agent, or Firm*—King & Schickli, PLLC

(57) ABSTRACT

Novel substituted pentacenes and electronic devices made with those substituted pentacenes are disclosed.

8 Claims, 4 Drawing Sheets

$\rho = 3 \times 10^{10}$ Ω-cm $\rho = 5 \times 10^{8}$ Ω-cm $\rho = 2.5 \times 10^{6}$ Ω-cm $\rho = 10^7$ $\Omega$-cm

SUBSTITUTED PENTACENES AND ELECTRONIC DEVICES MADE WITH SUBSTITUTED PENTACENES

This application claims the benefit of U.S. Provisional Patent Application Ser. No. 60/314,968 filed on Aug. 24, 2001.

This invention was made with Government support under NSF grant CHE-9875123 and Office of Naval Research grant N00014-99-1-0859. The Government may have certain rights in this invention.

TECHNICAL FIELD

The present invention relates generally to the field of organic semiconductors and, more particularly, to substituted pentacenes that exhibit improved electronic and processing properties as well as electronic devices made with those substituted pentacenes.

BACKGROUND OF THE INVENTION

Acenes, as a class of graphite substructures, are particularly attractive targets in the synthesis of organic semiconductors because of the predicted low band gap of the polymer. The usefulness of acene oligomers such as pentacenes are already showing in numerous electronics applications including, but not limited to, thin-film transistors (display technologies), solar cells and light-emitting diodes.

Solubilized acenes have received limited attention due to their synthetic inaccessibility. More specifically, while the properties and limitations of simple, linear conjugated organic systems have been well studied by either synthesis or structure-property determinations performed on series of oligomers, few such studies have been performed on fused aromatic systems, simply because of a lack of synthetic methodology available for their preparation. Although a number of researchers have made excellent approaches to planerized graphitic oligomers and polymers, and simple fused aromatic systems based on the graphite lattice are already being explored for the construction of field effect transistors (FETs) and molecular electronic devices, the lack of a reliable route to synthetically-tailored linearly fused aromatics has precluded the development of fully tunable organic materials.

The ability to tailor organic materials to maximize film-forming abilities or solid-state order cannot be understated, as such customization will allow the use of such systems as components for EMI shielding or corrosion-resistant coatings and as electrodes for flexible flat-panel displays or solar panels. The charge-storing ability of the aromatic polymers also has application in the fabrication of lightweight, moldable organic batteries. Functionalization will also allow us to explore self-organization in these graphite-like systems. Pendent groups on an oligoacene can be used to alter the solid-state ordering of the material.

The present invention relates to substituted pentacenes that have been, functionalized with pendent groups tailored to influence the processability, solid-state order and stability of the resulting material. Advantageously, the substituted pentacenes of the present invention may be prepared on a large scale at a low cost: necessary characteristics for eventual commercial applications. Additionally, the substituted pentacenes have significantly improved electronic properties when compared to pure pentacene materials.

SUMMARY OF THE INVENTION

The present invention relates to novel substituted pentacene compounds comprising the formula:

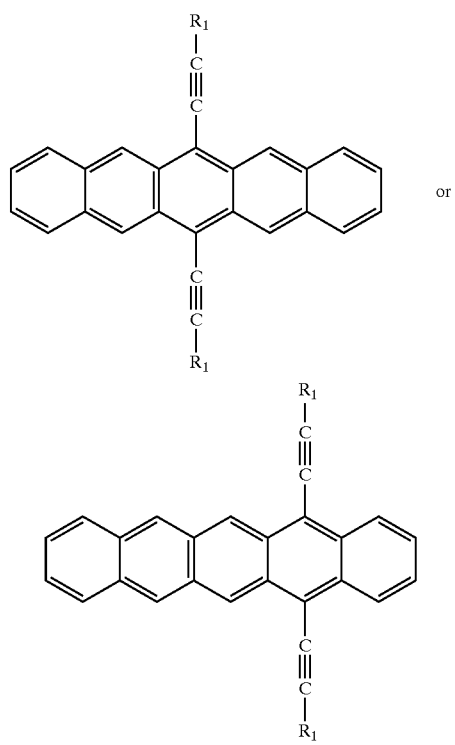

wherein $R_1$=a branched or unbranched alkane having $C_{2-18}$, a branched or unbranched alkyl alcohol having $C_1$–$C_{18}$, a branched or unbranched alkene having $C_{2-18}$, an aryl or heteroaryl (e.g. thiophene, pyridine) having $C_{4-18}$, an alkylaryl or alkyl-heteroaryl having $C_{5-32}$, a ferrocenyl or $SiR_2$ where $R_2$=hydrogen, a branched or unbranched alkane having $C_{1-10}$, a branched or unbranched alkyl alcohol having $C_1$–$C_{10}$, or a branched or unbranched alkene having $C_{2-10}$.

In accordance with yet another aspect of the present invention an electronic film is constructed from the novel substituted pentacene compounds of the present invention. Still further a transistor and photovoltaic device including one or more of the novel compounds of the present invention are also provided.

BRIEF DESCRIPTION OF THE DRAWING FIGURES

The accompanying drawing incorporated in and forming a part of the specification, illustrates several aspects of the present invention and together with the description serves to explain the principles of the invention. In the drawing.

Figure 1:
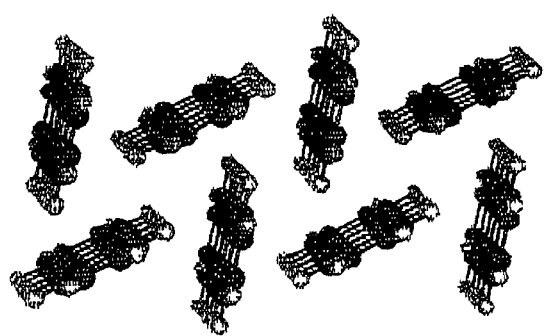
FIG. 1 illustrates the solid-state order or herringbone packing pattern of unsubstituted pentacene.

Reference will now be made in detail to the present invention as illustrated in the drawings figures.

DETAILED DESCRIPTION OF THE INVENTION

The novel substituted pentacene compounds of the present invention are prepared by a relatively simple and straightforward method. The compounds are prepared by the addition of alkyne-based anions to a pentacene quinone starting material. This addition reaction is followed by a deoxygenation reaction utilizing a deoxygenating reagent such as tin (II) chloride in dilute HCl. This two-step reaction process leads to near-quantitative yields of the expected pentacene.

The pentacene quinone derivative required as a starting material for the reaction to prepare the compounds of the present invention is easily prepared from a simple 1,4-diketone (or di-enol) and aromatic 1,2-dialdehydes, as exemplified by the following two reactions:

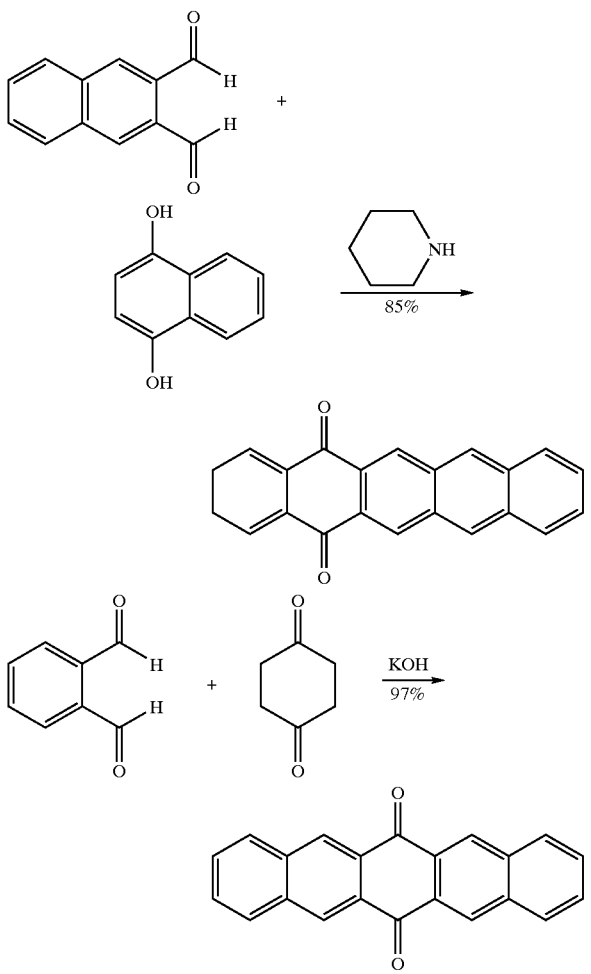

The conditions required for this condensation reaction are particularly mild, and amenable to most functional groups. Similar reaction conditions can be used to prepare unsymmetrical pentacene quinones. Advantageously, the present reaction allows convenient, selective functionalization. The reactions may also be advantageously carried out on a large scale and at a very low cost. The following synthesis and examples are presented to further illustrate the invention, but it is not to be considered as limited thereto.

EXAMPLE 1

Reagents were obtained from the Aldrich Chemical Company (Milwaukee, Wis.) or Acros Organics (Pittsburgh, Pa.). Alkynes were purchased from GFS Chemicals (Powell, Ohio). THF was purified by passage through activated alumina columns under dry nitrogen. Moisture sensitive reactions were carried out in oven-dried glassware under dry nitrogen. TLC was carried out on MERCK Silica Gel 60 thin layer plates. Silica gel chromatography was performed on Fisher Brand silica gel (170–400 mesh). The pentacenequinones used for these syntheses are known compounds and were recrystallized from N,N-dimethylformamide before use.

To a flame dried 60 mL Teflon screw-stoppered glass tube was added 4.9 mL of a 2.0 M solution of isopropyl magnesium chloride in THF. The appropriate acetylene was added via syringe, followed by an additional 10 mL of dry THF. The cap was replaced and the tube was placed in a 60° C. oil bath for 15 minutes. The tube was removed from the bath and the solution was allowed to cool. 0.5 g (1.62 mmol, 0.16 equivalents based on the Grignard reagent) of the appropriate quinone was added to the solution, the cap replaced and the tube placed back into the oil bath until there was no solid quinone visible in the tube, (generally 30–60 minutes). The tube was removed from heat and allowed to cool. A solution of 10% aqueous HCl saturated with $SnCl_2$ was added carefully to the tube until no further reaction occurred on addition. The reaction solution turned deep blue. The cap was replaced, the tube was given a vigorous shake to break up magnesium salts and render the solution homogenous, and the tube returned to the oil bath for 15 minutes. The tube was removed and allowed to cool. The solution was filtered through a short pad of silica gel eluting with dichloromethane. The solvent was removed in vacuo. The resulting crude product was purified by chromatography on silica gel, first eluting excess acetylene with hexane, then eluting the product as a deep blue band with a mixture of hexane and dichloromethane. Recrystallization yielded crystals suitable for crystallography.

6,13-bis(triisopropylsilylethynyl)pentacene: The product was synthesized from 6,13 pentacenequinone to give 0.85 g (1.33 mmol, 82%) of deep blue plates: mp. 180° C. (acetone); $^1$H NMR (400 MHz, $CDCl_3$): δ1.39 (s, 42H), 7.43 (dd, J=6.6, 3.0 Hz, 4H), 7.99 (dd, J=6.6, 3.0 Hz, 4H), 9.32 (s, 4H). $^{13}$C NMR (400 MHz, $CDCl_3$): δ_11.90, 19.22, 104.91, 107.39, 118.55, 126.24, 126.53, 128.90, 130.58, 132.49. MS (EI, 70 eV) m/z 638 ($M^+$, $C_{44}H_{54}Si_2$ requires 638). UV/Vis ($CH_2Cl_2$): $\lambda_{max}$ (ε) 307 (72000), 329 (32000), 350 (7000), 439 (3000), 550 (4000), 592 (10000), 643 (20000). Anal. Calcd for $C_{44}H_{54}Si_2$: C, 82.69; H, 8.51. Found C, 83.04; H, 8.26.

6,13-bis(triethylsilylethynyl)pentacene: The product was synthesized from 6,13-pentacenequinone to give 0.84 g (1.5 mmol, 94%) of thin blue plates (dichloromethane/ethanol): mp. 210° C.; $^1$H NMR (400 MHz, $CDCl_3$): δ0.89 (q, J=4.0 Hz, 12H), 1.20 (t, J=4.0 Hz, 18H), 7.14 (dd, J=5.6, 1.2 Hz, 4H), 7.91(dd, J=5.6, 1.2 Hz, 4H), 9.53(s, 4H). $^{13}$C NMR (400 MHz, $CDCl_3$): δ4.84, 7.87, 104.04, 108.17, 118.24, 125.99, 126.24, 128.67, 130.50, 132.29. MS (EI, 70 eV) m/z 554 ($M^+$, $C_{38}H_{42}Si_2$ requires 554). Anal. Calcd. for $C_{38}H_{42}Si_2$ C, 82.24%; H, 7.62%. Found C, 82.35%; H, 7.95%.

5,14-bis(triisopropylsilylethynyl)pentacene: The product is synthesized from 5,14 pentacenequinone.

5,14-bis(triethylsilylethynyl)pentacene: The product is synthesized from 5,14 pentacenequinone.

The substituted pentacene compounds of the present invention demonstrate remarkable physical and electronic properties. These compounds exhibit significant photoconductivity, electrochromic properties, and electroluminescent properties.

Many of these properties may be explained by reviewing the structure of the packed compound. Pure pentacene packs in a herringbone fashion in order to maximize both edge-to-face and face-to-face interactions. The packing of pure pentacene is demonstrated in FIG. 1.

For electronic applications, packing motifs which maximize face-to-face interactions (Π—Π stacking) are typically required. The first step in altering the "natural" packing of pentacene is to disrupt edge-to-face interaction by substitution at a peri position. In order to maintain a proper steric environment for Π-stacking, the substituents must be held away from the aromatic core by a sterically undemanding spacer such as an alkyne. For simple disubstituted pentacenes with nearly spherical functional groups, the solid-state ordering of these materials is relatively easy to predict and therefore controlled.

Figure 2A:
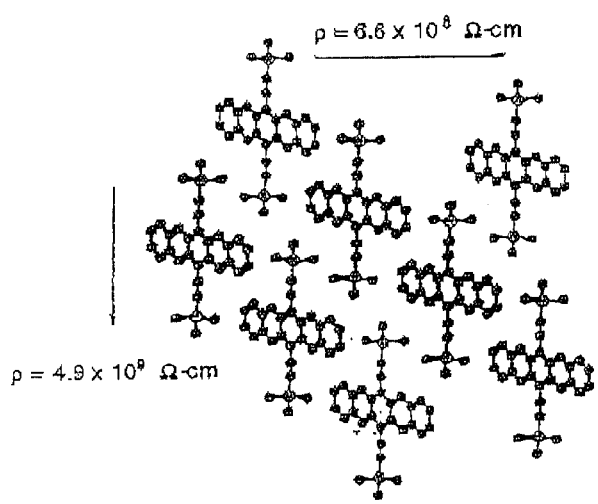
FIGS. 2a and 2b illustrate the solid-state order of 6,13-bis(trimethylsilylethynyl)pentacene.
Figure 2B:
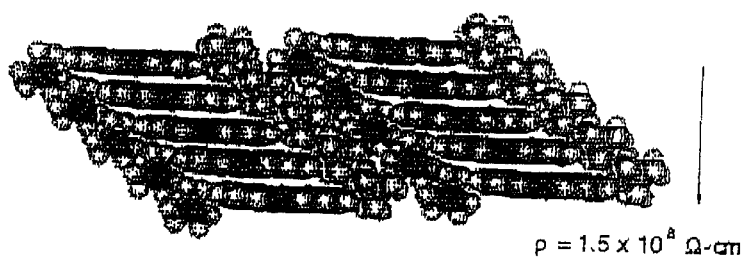

The packing arrangement of the novel compounds of the present invention may best be exemplified by considering 6,13-bis(trimethylsilylethynyl)pentacene (hereinafter referred to as TMS) and 6,13-bis(triisopropylsilylethynyl)pentacene (hereinafter referred to as TIPS). The typical solid-state order of "small-group" substituted pentacenes is demonstrated by the TMS compound illustrated in FIGS. 2a–2b. Small-group packing is characterized by pseudo one-dimensional slip-stacked acenes, with the silyl groups from adjacent stacks filling the remaining volume in the stack. The amount of overlap of aromatic backbone within the stack is determined by the size of the solubilizing group and varies from 60% for the TMS compound to about 50% for a compound substituted with the bulky t-butyldimethylsilyl group.

Figure 3A:
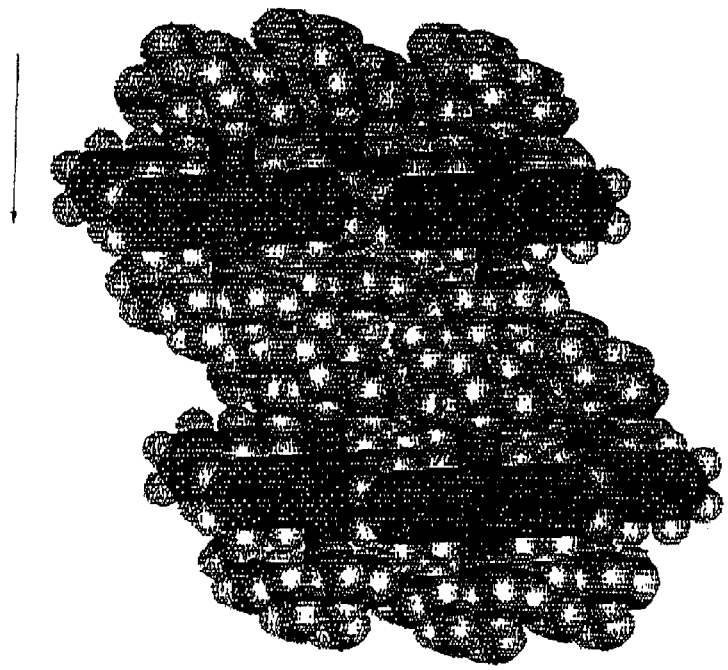
FIGS. 3a and 3b illustrate the solid-state order of 6,13-bis(triisopropylsilylethynyl)pentacene.
Figure 3B:
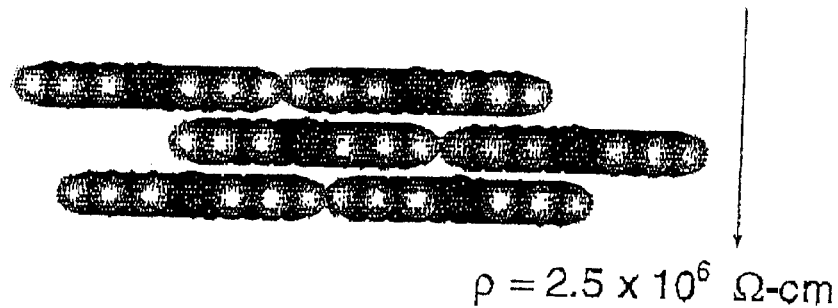

Larger functional groups cause a change in packing which leads to segregation of the silyl groups, resulting in two-dimensional stacking of the aromatic portions of the pentacene in a "running bond" type pattern (see FIGS. 3a–3b illustrating the packing of the TIPS compound).

The resistivity of these crystals appears to mirror the efficiency of the Π-stacking. As would be expected, the resistivity is highly anisotropic, with the lowest values corresponding to those measured down the Π-stacking axis. The pseudo one-dimensional stacking of the small-group acenes leads to a resistivity of approximately $10^7$ Ωcm while the two-dimensional order present in the TIPS functionalized acene leads to an order of magnitude drop to $10^6$ Ωcm. Both of these values are dramatically lower than the value reported for herringbone-packed pentacene, $10^{14}$ Ωcm.

Figure 4A:
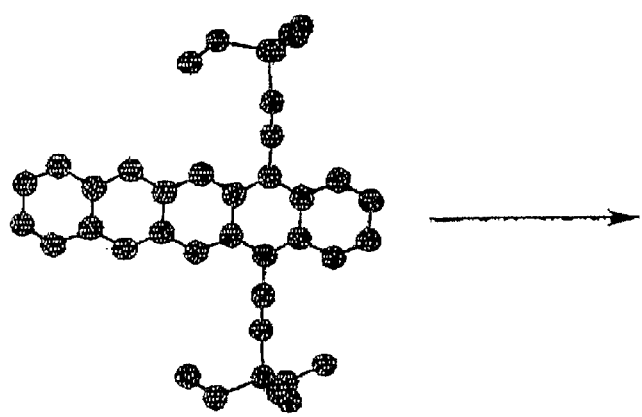
FIGS. 4a and 4b illustrate the solid-state order of 5,14-bis(triethylsilylethynyl)pentacene.
Figure 4B:
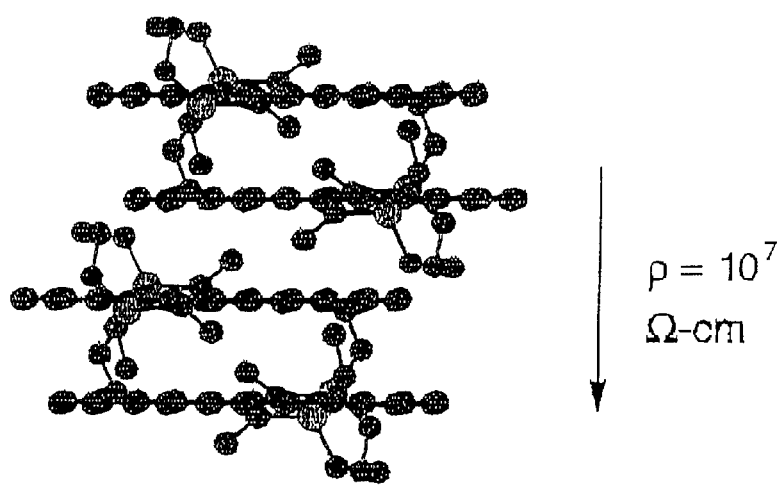

Columnar packing may be obtained in solid-state arrangements of offset substituted pentacenes such as 5,14-bis(triethylsilylethynyl)pentacene as illustrated in FIGS. 4a–4b. Such offset molecules are able to form efficient columns of stacked aromatic groups, with a 90% overlap of Π-surfaces along the stacking direction. This efficient one-dimensional packing leads to a resistivity of approximately $10^7$ Ωcm.

Advantageously, efficient packing of acenes in the solid state appears to import a significant degree of oxidative and photochemical stability to the molecules within the crystal. The crystalline derivatives of the compounds of the present invention are remarkably robust compared to those derivatives that are powders, which often decompose within a few hours after isolation. Preliminary investigations indicate that increased Π-stacking enhances this effect.

Figure 5:
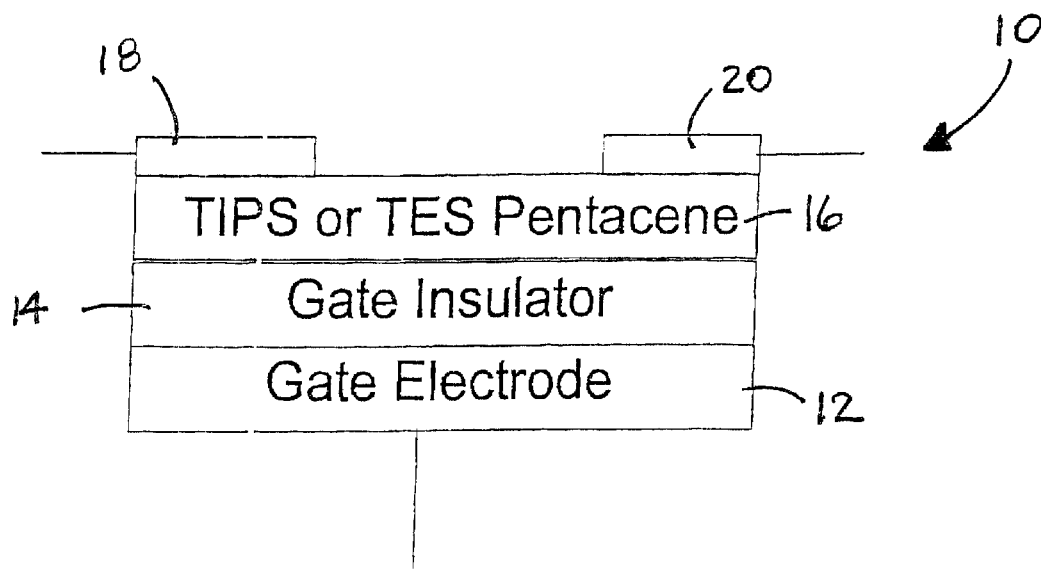
FIG. 5 is a schematical representation of a thin-film transistor of the present invention.
Figure 6:
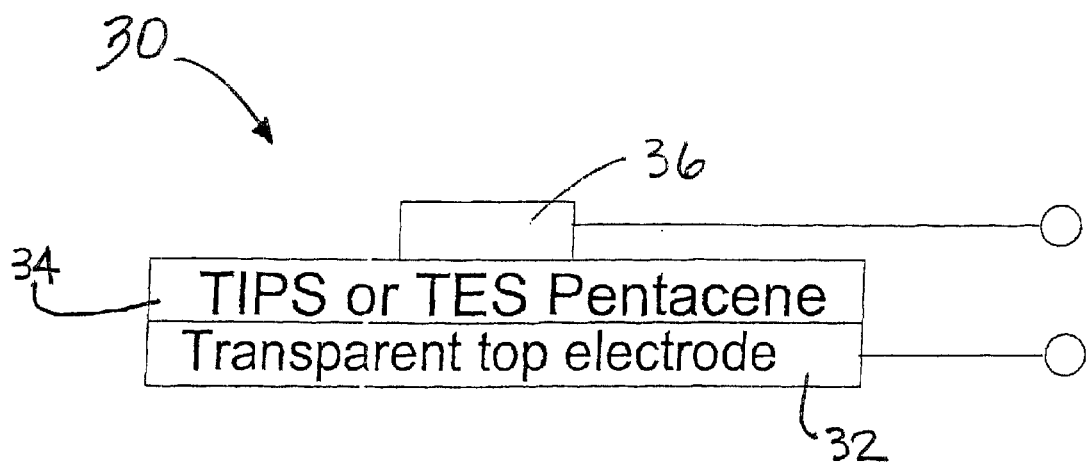
FIG. 6 is a schematical representation of a photovoltaic device of the present invention.

A number of useful electronic devices may be constructed from the novel substituted pentacenes of the present invention. An example of a thin-film transistor is illustrated in FIG. 5 and an example of a photovoltaic device is illustrated in FIG. 6.

The thin-film transistor 10 is comprised of a gate electrode 12 of a type known in the art, an insulator 14 and a semiconductor 16 in the form of a thin layer or film of the previously described substituted pentacenes of the present invention. In addition, the transistor 10 includes a conductive source electrode 18 and a drain electrode 20 both operatively connected to the semiconductor 16.

The insulator 14 may, for example, be a dielectric or metal oxide or even an insulating polymer like poly(methylmethacrylate). The conducting source and drain electrodes 18, 20 may be metals known in the art to be useful as electrodes, heavily doped semiconductors such as silicon or even a conducting polymer.

The photovoltaic device 30 comprises a transparent conductive electrode 32, a semiconductor 34 in the form of a thin layer or film of the previously described substituted pentacenes of the present invention and a bottom electrode 36. The bottom electrode 36 may either be constructed from a low work-function metal (aluminum, magnesium, calcium, etc.) to form a diode-like device or a higher work-function metal (e.g. gold, silver) to form an ohmic contact to the semiconductor 34.

What is claimed is:
1. A semiconductor, comprising:
 a body constructed from a material selected from a group consisting of

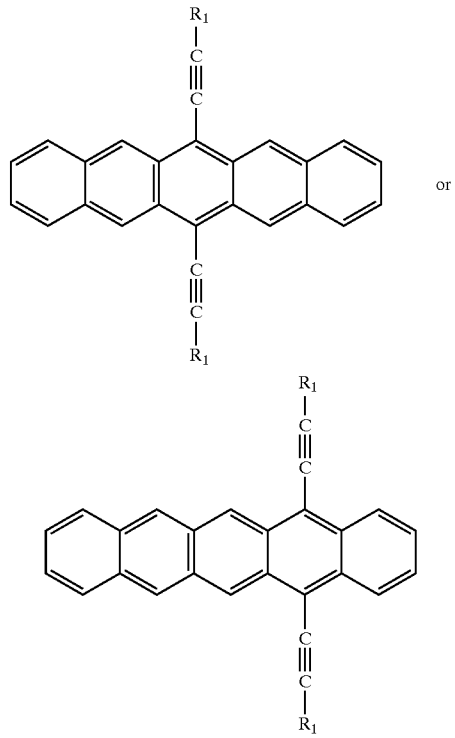

wherein $R_1$=a branched or unbranched alkane having $C_{2-18}$, a branched or unbranched alkyl alcohol having $C_1$–$C_{18}$, a branched or unbranched alkene having $C_{2-18}$, an aryl or heteroaryl (e.g. thiophene, pyridine) having $C_{4-8}$, an alkylaryl or alkyl-heteroaryl having $C_{5-32}$, a ferrocenyl or $SiR_2$ where $R_2$=hydrogen, a branched or unbranched alkane having $C_{1-10}$, a branched or unbranched alkyl alcohol having $C_1$–$C_{10}$, or a branched or unbranched alkene having $C_{2-10}$.

2. A semiconductor of claim 1 wherein said body is a film.

3. A thin-film transistor, comprising:

a gate electrode;

a semiconductor constructed from a material selected from a group consisting of

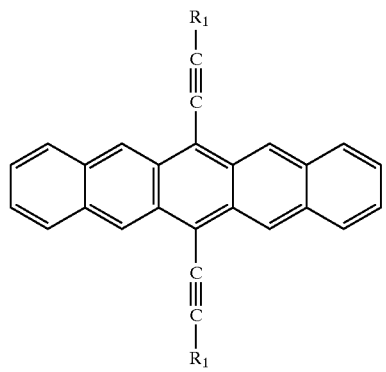

or

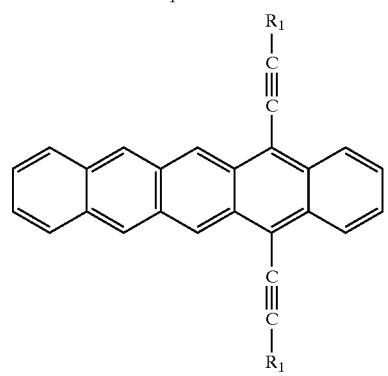

wherein $R_1$=a branched or unbranched alkane having $C_{2-18}$, a branched or unbranched alkyl alcohol having $C_{1-18}$, a branched or unbranched alkene having $C_{2-18}$, an aryl or heteroaryl (e.g. thiophene, pyridine) having $C_{4-18}$, an alkylaryl or alkyl-heteroaryl having $C_{5-32}$, a ferrocenyl or $SiR_2$ where $R_2$=hydrogen, a branched or unbranched alkane having $C_{1-10}$, a branched or unbranched alkyl alcohol having $C_1$–$C_{10}$, or a branched or unbranched alkene having $C_{2-10}$;

an insulator between said gate electrode and said semiconductor;

a source electrode; and a drain electrode.

4. A photovoltaic apparatus, comprising:

a transparent conductive electrode;

a semiconductor constructed from a material selected from a group consisting of

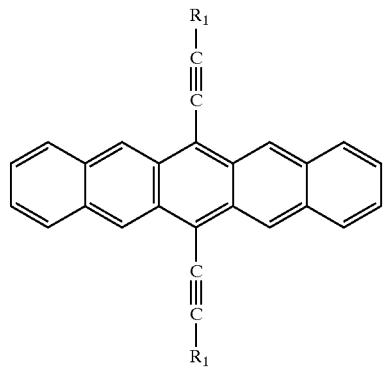

or

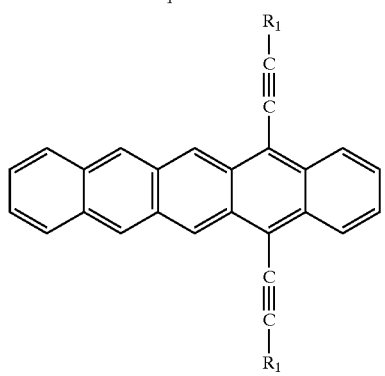

wherein $R_1$=a branched or unbranched alkane having $C_{2-18}$, a branched or unbranched alkyl alcohol having $C_1$–$C_{18}$, a branched or unbranched alkene having $C_{2-18}$, an aryl or heteroaryl (e.g. thiophene, pyridine) having $C_{4-18}$, an alkylaryl or alkyl-heteroaryl having $C_{5-32}$, a ferrocenyl or $SiR_2$ where $R_2$=hydrogen, a branched or unbranched alkane having $C_1$–$C_{10}$, a branched or unbranched alkyl alcohol having $C_1$–$C_{10}$, or a branched or unbranched alkene having $C_{2-10}$; and a bottom electrode.

5. A compound, comprising: 6,13-bis(triethysilylethynyl)pentacene.

6. A compound, comprising: 6,13-bis(triisopropylsilylethynyl)pentacene.

7. A compound, comprising: 5,14-bis(triethylsilylethynyl)pentacene.

8. A compound, comprising: 5,14-bis(triisopropylsilylethynyl)pentacene.

* * * * *

UNITED STATES PATENT AND TRADEMARK OFFICE
CERTIFICATE OF CORRECTION

PATENT NO. : 6,690,029 B1
DATED : February 10, 2004
INVENTOR(S) : John E. Anthony, David L. Eaton and Sean Parkin It is certified that error appears in the above-identified patent and that said Letters Patent is hereby corrected as shown below:

Column 2,
Line 32, "$C_1$-$C_{18}$" should be -- $C_{1-18}$ --
Line 38, "$C_1$-$C_{10}$" should be -- $C_{1-10}$ --

Column 6,
Line 63, "$C_1$-$C_{18}$" should be -- $C_{1-18}$ --

Column 7,
Line 1, "$C_1$-$C_{10}$" should be -- $C_{1-10}$ --

Column 8,
Line 36, "$C_1$-$C_{18}$" should be -- $C_{1-18}$ --
Lines 40 and 41, "$C_1$-$C_{10}$" should be --$C_{1-10}$ --

Signed and Sealed this

Fifteenth Day of June, 2004

JON W. DUDAS
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,690,029 B1 | Page 1 of 1 |
| APPLICATION NO. | : 10/143405 | |
| DATED | : February 10, 2004 | |
| INVENTOR(S) | : John E. Anthony, David L. Eaton and Sean Parkin | |

It is certified that error appears in the above-identified patent and that said Letters Patent is hereby corrected as shown below:

Column 2, line 35: "$SiR_2$" should be --$Si(R_2)_3$--

Column 6, line 66: "$SiR_2$" should be --$Si(R_2)_3$--

Column 7, line 44: "$SiR_2$" should be --$Si(R_2)_3$--

Column 8, line 39: "$SiR_2$" should be --$Si(R_2)_3$--

Signed and Sealed this

Thirty-first Day of May, 2011

David J. Kappos
*Director of the United States Patent and Trademark Office*